United States Patent [19]

Oldfield et al.

[11] Patent Number: 5,587,934
[45] Date of Patent: Dec. 24, 1996

[54] AUTOMATIC VNA CALIBRATION APPARATUS

[75] Inventors: William W. Oldfield, Redwood City, Calif.; Thomas R. Brinkoetter, Portland, Oreg.; Todd D. Antes, San Jose, Calif.

[73] Assignee: Wiltron Company, Morgan Hill, Calif.

[21] Appl. No.: 630,195

[22] Filed: Apr. 10, 1996

Related U.S. Application Data

[63] Continuation-in-part of Ser. No. 140,781, Oct. 21, 1993, abandoned.

[51] Int. Cl.$^6$ .................................................. G01R 27/06
[52] U.S. Cl. ..................... 364/571.01; 364/484; 364/485; 364/487; 364/571.04
[58] Field of Search ........................ 364/571.01, 571.04, 364/484–487, 601, 638, 646; 324/76.12, 76.39, 76.19, 76.22, 76.23, 76.13, 76.26, 637, 605, 630, 650, 615

[56] References Cited

U.S. PATENT DOCUMENTS

| | | | |
|---|---|---|---|
| 4,680,538 | 7/1987 | Dalman et al. | 324/638 |
| 4,703,433 | 10/1987 | Sharrit | 324/76.22 |
| 4,816,767 | 3/1989 | Cannon et al. | 364/571.04 |
| 4,853,613 | 8/1989 | Sequeira et al. | 324/638 |
| 4,982,164 | 1/1991 | Schiek et al. | 324/638 |
| 5,191,294 | 3/1993 | Grace et al. | 324/638 |
| 5,276,411 | 1/1994 | Woodin, Jr. et al. | 333/22 R |
| 5,307,284 | 4/1994 | Brunfeldt et al. | 364/485 |
| 5,313,166 | 4/1994 | Eul et al. | 364/571.01 |
| 5,321,364 | 6/1994 | Nukiyama et al. | 324/615 |
| 5,336,988 | 8/1994 | Chmielewski et al. | 324/76.19 |
| 5,434,511 | 7/1995 | Adamian et al. | 324/601 |
| 5,467,021 | 11/1995 | Adamian et al. | 324/601 |

OTHER PUBLICATIONS

Engen, Glenn F., et al., *The Multi–State Two Port: An Alternative Transfer Standard*, ARFTG Diges, Spring 93.
Abstract: "A Novel Procedure for Network Analyzer Calibration and Verification;" V. Adamian, Jun. 1993.
Product Information Sheet: ATN Microwave, Inc., Jun. 1991.

*Primary Examiner*—James P. Trammell
*Assistant Examiner*—Hal P. Wachsman
*Attorney, Agent, or Firm*—Fliesler, Dubb, Meyer & Lovejoy

[57] ABSTRACT

An automatic VNA calibration apparatus is described which requires only a single connection at each of two test ports on a VNA and the pressing of one button. The apparatus comprises a housing for housing electrical components and a multi-throw switch which is controlled by a controller coupled to the housing. The switch is switched between a plurality of positions for coupling to the VNA a series of different calibration and verification components. The components need not be "perfect" standards so long as their values, including the phase shifts which they provide, are accurately measured.

10 Claims, 1 Drawing Sheet

5,587,934

AUTOMATIC VNA CALIBRATION APPARATUS

This is a continuation of application Ser. No. 08/140,781 filed Oct. 21, 1993, abandoned.

BACKGROUND OF THE INVENTION

1. Field of the Invention

The present invention relates to the calibration of vector network analyzers in general and in particular to an automatic calibration apparatus therefor which does not require the use of "perfect" calibration standards.

2. Description of the Related Art

Microwave and RF vector network analyzers (VNA) require calibration to enhance the accuracy of the system. Typically the calibration consists of measuring known "perfect" standards and transferring the accuracy of the standards to the VNA.

In practice, prior known calibration techniques typically require the connection of at least three standards between the test ports of a VNA as well as the pressing of a multiplicity of front panel buttons in a correct sequence. This is a time consuming process requiring a certain level of expertise. Verifying the accuracy of the calibration is also a time consuming process requiring expertise.

SUMMARY OF THE INVENTION

In view of the foregoing, principal objects of the present invention are a method and apparatus comprising an automatic VNA calibration apparatus which requires an operator to simply connect a calibration/verification box to each one of two test ports on a VNA and press one button. The apparatus then automatically calibrates the VNA and verifies the calibration.

Externally the calibration/verification box comprises a pair of RF connectors for connecting the box to the VNA test ports and connectors for coupling the box to a controller.

Internally the box comprises one set of microwave/radio frequency (RF) components for calibrating the VNA, another set of RF components for verifying the accuracy of the VNA after it has been calibrated and two multi-throw switches for placing the RF components between the VNA test ports during the calibration and verification operations.

The RF components do not have to be perfect and even if they were, their perfection would be masked by the switches. However the RF connectors connecting the calibration/verification box to the VNA test ports are carefully measured in each of the available switch positions.

The controller, which may be incorporated in the VNA, is provided with a calibrate button/switch to initiate the calibration and verification operations and is programmed to control the sequence of the operation of the two multi-throw switches, to process the measured S-parameters of the RF components at the VNA test ports in each of the switch positions in a conventional manner, to use the information obtained to correct any inaccuracies in the VNA, and to verify the corrections made. Optionally, the controller may also be provided with a second button/switch for initiating a separate or additional verification operation any time after the initial calibration/verification.

As indicated above, a principal advantage of the apparatus and method of the present invention is that the RF components used for calibrating the VNA do not have to be "perfect" so long as their S-parameters are accurately measured and stored for use by the controller. If they are accurately measured and stored, the information can be used for calibration. Of course, the measured artifacts should have the same general characteristics as those of a test standard. For example, one of the RF components could provide a low loss, low reflective through-connection between the test ports. Another could terminate each of the test ports with a low reflection characteristic line (e.g. matching) impedance. Another RF component could short the terminals to ground so as to provide a highly reflective termination producing a phase shift of 180 degrees.

Still another RF component/switch position could "open" the terminals, i.e. provide an infinite impedance, so as to provide a highly reflective termination providing a phase shift of zero (0) degrees.

In general, while four or more RF components could be used for calibration, only three components are necessary so long as the S-parameters of the three components are known and widely separated over the Smith chart.

For purposes of verification, two additional RF components are provided for providing, respectively, a through-line and an attenuation for producing known signal S-parameters.

The elimination of the requirement for "perfect" standards allows the various calibration and verification artifacts to be incorporated into a single connection "box". The system controller performs all of the necessary adjustments required of the calibration sequence, relieving the operator of the task. The controller then evokes the verification sequence after the calibration is complete.

BRIEF DESCRIPTION OF THE DRAWING

The above and other objects, features and advantages of the present invention will become apparent from the following detailed description with reference to a drawing in which.

DESCRIPTION OF THE PREFERRED EMBODIMENT

Figure 1:
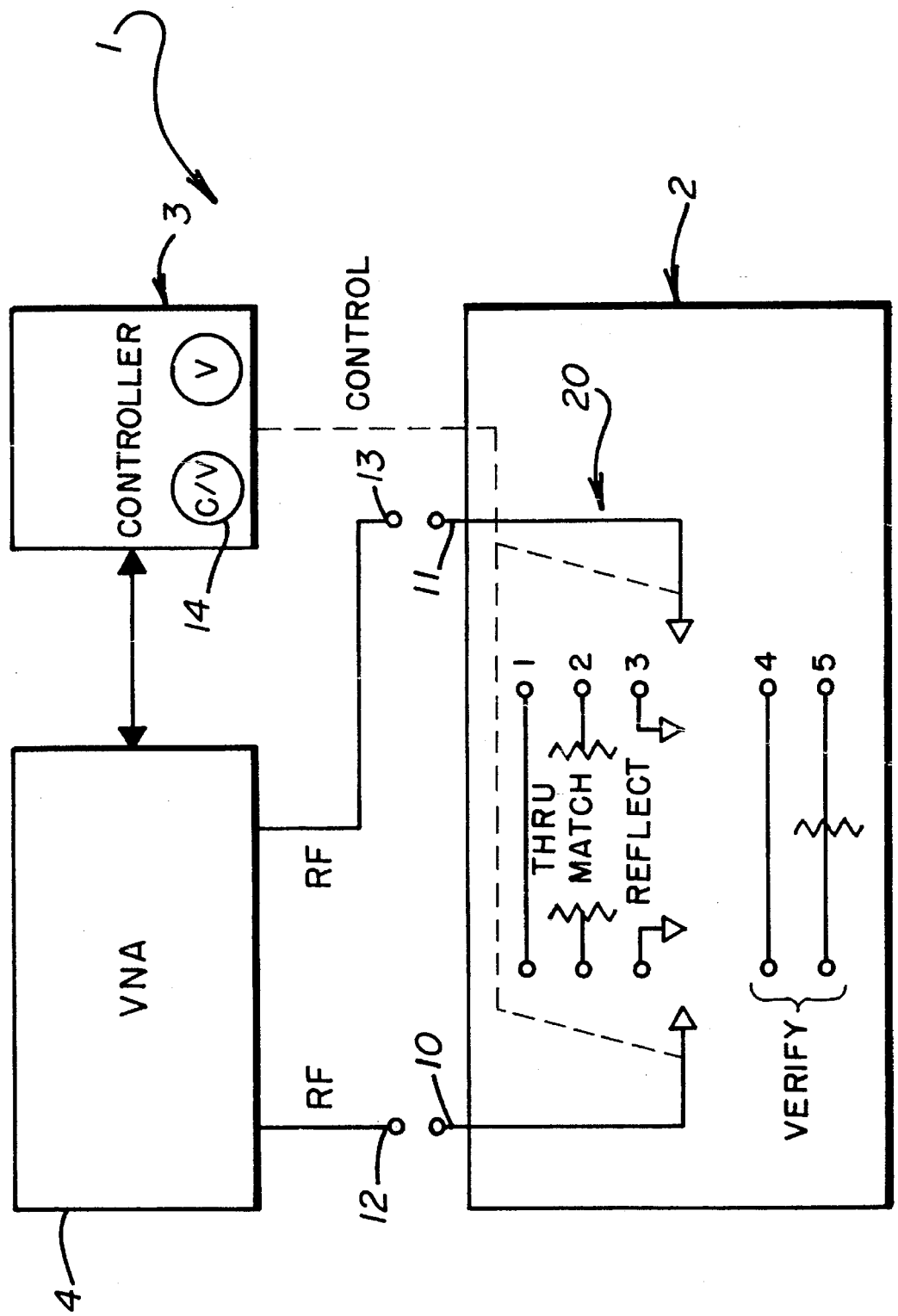
FIG. 1 shows a block diagram/schematic of a calibration/verification box and controller coupled to a VNA according to the present invention.

Referring to FIG 1, there is provided in accordance with the present invention an automatic vector network analyzer (VNA) calibration apparatus designated generally as 1. In the apparatus 1 there is provided a calibration/verification box or housing 2 for housing a plurality of electrical components and a programmable controller 3. The housing 2 and controller 3 are coupled to a VNA 4.

In the housing 2 there is provided a first and a second terminal 10 and 11. Each of the terminals 10 and are provided with microwave/radio frequency (RF) connectors for connecting the housing 2 to corresponding RF connectors on corresponding test ports/terminals 12 and 13 on the VNA 4.

In the interior of the housing 2 there is provided a multi-throw switch assembly designated generally as 20 having a plurality of at least five positions 1–5 for coupling predetermined electrical components between the first and second terminals 10, 11. For example, the switch assembly 20 has a first position for coupling a through-line between the terminals 10 and 11 so as to allow the transmission of a signal from the first terminal 12 to the second terminal 13 on the VNA 4 with a known magnitude and phase shift; a second position for selectively coupling a substantially non-reflective termination to each of said first and said second terminals 12, 13 located on said VNA 4, respectively; and a third position for selectively coupling each of said first and said second terminals 12, 13 located on said VNA 4 to a termination which causes the signal incident thereon to be reflected with a known magnitude and phase shift, respectively. Each of the switch positions 1–3 are used during calibration of the VNA.

In general, while more than three RF components could be used for calibration, only three are necessary so long as their respective S-parameters are known and widely spaced in terms of a Smith chart.

For purposes of verifying the accuracy of the VNA 4 after it has been calibrated, the switch assembly 20 is provided with at least two additional switch positions, i.e. positions 4 and 5, for selectively coupling at least a first and a second verifying electrical component between the first and second terminals 10, 11 on the housing 2. For example, the first electrical component used for verification comprises an electrical component which is constructed so as to allow the transmission of a signal from said first terminal 12 on said VNA 4 to said second terminal 13 on said VNA 4 with known S-parameters as a function of frequency. The second electrical component used for verification comprises an attenuator having a known attenuation and phase shift as a function of frequency. In a preferred embodiment of the present invention, the first verifying electrical component, which may be located at the position 5 of the switch 20, comprises a Beatty standard.

In operation, the operator merely connects the terminals 10, 11 of housing 2 to the terminals 12, 13 of the VNA 4 by means of the RF connectors and presses a calibration button 14 on the controller 3. The system controller 3, which is suitably programmed in any well known manner, then performs the necessary tasks required for calibration and verification. These tasks include switching the multi-throw switch 20 to couple the above-described discrete electrical components to the terminals of the VNA in a predetermined sequence, measuring the S-parameters at the VNA ports for each switch position, comparing this information with stored information as to the expected values for each of the switch positions and using all of the information thus obtained to correct the inaccuracies of the VNA. Thereafter, the controller moves the switch 20 to positions 4 and 5 to verify the accuracy of the calibrations.

To provide for verification of the calibrations at a subsequent time there is further provided a verify button 15 on the controller 3 for re-verifying the calibration at any time that the verification button is depressed.

The particular sequence in which the calibration and the verification of the VNA 4 occurs is not important so long as the selected sequence is noted and the proper processing of the VNA signals corresponds to the selected sequence.

While a preferred embodiment of the present invention is described above, it is contemplated that numerous modifications may be made thereto for particular applications without departing from the spirit and scope of the present invention. For example, if measurements of S-parameters of a device occur at frequencies other than a frequency at which the VNA is calibrated, well known interpolation functions may be used to interpolate and store the error terms between calibration points. Accordingly, it is intended that the embodiments described be considered only as illustrative of the present invention and that the scope thereof should not be limited thereto but be determined by reference to the claims hereinafter provided.

What is claimed is:

1. A method of calibrating a Vector Network Analyzer (VNA), the VNA having first and second terminals, the method using discrete electrical components, the method comprising the steps of:

coupling a first one of the discrete electrical components between the first and second terminals of said VNA, said first discrete electrical component being constructed so as to allow the transmission of a signal from said first terminal of said VNA to said second terminal of said VNA with known scattering parameters;

coupling a second one of the discrete electrical components comprising a substantially non-reflective termination to each of said first and said second terminals of said VNA, respectively;

coupling a third one of the discrete electrical components comprising a termination which causes the signal incident thereon to be reflected with a phase shift of 180 degrees to the first and second terminals of the VNA, respectively;

coupling a fourth one of the discrete electrical components comprising a termination which causes the signal incident thereon to be reflected with a phase shift of zero (0) degrees to the first and second terminals of the VNA, respectively; measuring scattering parameters at said first and second terminals of said VNA after each of said above coupling steps; and comparing the measured scattering parameters with scattering parameters previously measured and stored to determine calibration values which can be utilized to correct errors introduced by said VNA.

2. A method of claim 1 further comprising the steps of:

coupling a verifying electrical component having scattering parameters which have been previously measured and stored between the first and second terminals of the VNA;

measuring scattering parameters at said first and second terminals of the VNA after the step of coupling a verifying electrical component;

correcting the measured scattering parameters for the verifying electrical component using the calibration values; and comparing the corrected scattering parameters to the stored scattering parameters of the verifying electrical component to verify the accuracy of the calibration values.

3. A calibration apparatus for use in calibrating a Vector Network Analyzer (VNA), the VNA having a terminal, the calibration apparatus comprising:

a terminal for connecting to the terminal of the VNA;

a set of reflection components providing a set of known scattering parameters which enable calculation of calibration values used to correct errors introduced by the VNA;

a switch having a first end coupled to the terminal of the calibration apparatus and a second end selectively connectable to individual ones of the set of reflection components; and a controller connected to the switch enabling the second end of the switch to be selectively connectable to individual ones of the set of reflection components.

4. The calibration apparatus of claim 3 wherein the known scattering parameters for the set of reflection components are widely spaced on a Smith chart.

5. The calibration apparatus of claim 3 wherein the set of reflection components comprises a short, an open and a low reflection impedance.

6. A calibration apparatus for use in calibrating a Vector Network Analyzer (VNA), the VNA having a first and a second terminal, the calibration apparatus comprising:

a first terminal for connecting to the first terminal of the VNA;

a second terminal for connecting to the second terminal of the VNA;

a first set of reflection components;

a second set of reflection components;

a through line, wherein the first set of reflection components, second set of reflection components and the through line provide a set of known scattering parameters which enable calculation of calibration values used to correct errors introduced by the VNA;

a first switch having a first end connected to the first terminal of the calibration apparatus and a second end selectively connectable to individual ones of the first set of reflection components and the through line;

a second switch having a first end connected to the second terminal of the calibration apparatus and a second end selectively connectable to individual ones of the second set of reflection components and the through line; and a controller coupled to the first and second switch for enabling the second end of the first switch to be selectively connectable to individual ones of the first set of reflection components and the through line, and for enabling the second end of the second switch to be selectively connectable to individual ones of the second set of reflection components and the through line.

7. The calibration apparatus of claim 6 wherein the controller is further coupled to the VNA to receive measured scattering parameters for the first set of reflection components, the second set of reflection components and the through line made by the VNA, and to provide the calibration values to said VNA, the controller determining the calibration values by comparing the known scattering parameters to the measured scattering parameters.

8. The calibration apparatus of claim 6 further comprising:

a first verifying electrical component; and a second verifying electrical component, wherein the first and second switch further selectably enable coupling of the first and second verifying electrical components between said first and said second terminals of the calibration apparatus to enable verification of the accuracy of the calibration values.

9. The calibration apparatus of claim 8 wherein said first verifying electrical component comprises an electrical component which is constructed so as to allow the transmission of a signal from said first terminal of said VNA to said second terminal of said VNA with known scattering parameters as a function of frequency and said second verifying electrical component comprises an attenuator having known scattering parameters as a function of frequency.

10. The calibration apparatus of claim 6 wherein the first set of reflection components comprises a short, an open and a low reflection impedance and wherein the second set of reflection components comprises a short, an open and a low reflection impedance.

* * * * *

UNITED STATES PATENT AND TRADEMARK OFFICE
CERTIFICATE OF CORRECTION

PATENT NO.  : 5,587,934
DATED       : December 24, 1996
INVENTOR(S) : Oldfield, et al.

It is certified that error appears in the above-indentified patent and that said Letters Patent is hereby corrected as shown below:

Column 2, line 53: after "and" and before "are" insert therefor --11--.

Signed and Sealed this

Tenth Day of June, 1997

Attest:

BRUCE LEHMAN

Attesting Officer

Commissioner of Patents and Trademarks